(12) United States Patent
Yanagisawa

(10) Patent No.: US 6,406,589 B1
(45) Date of Patent: Jun. 18, 2002

(54) PROCESSING APPARATUS FOR ETCHING THE EDGE OF A SILICON WAFER

(75) Inventor: Michihiko Yanagisawa, Ayase (JP)

(73) Assignee: Speedfam-Ipec Co Ltd, Kanagawa (JP)

( * ) Notice: Subject to any disclaimer, the term of this patent is extended or adjusted under 35 U.S.C. 154(b) by 0 days.

(21) Appl. No.: 09/461,816

(22) Filed: Dec. 16, 1999

(30) Foreign Application Priority Data

Dec. 22, 1998 (JP) .......................................... 10-364138

(51) Int. Cl.$^7$ ................................................ C23F 1/02
(52) U.S. Cl. ......................... 156/345; 216/58; 216/67; 451/66
(58) Field of Search ........................ 156/345; 216/58, 216/67; 451/66

(56) References Cited

U.S. PATENT DOCUMENTS

| | | | | |
|---|---|---|---|---|
| 4,872,938 A | * | 10/1989 | Davis et al. | 156/345 |
| 4,875,989 A | * | 10/1989 | Davis et al. | 204/298 |
| 5,458,734 A | * | 10/1995 | Tsukamoto | 156/643.1 |
| 5,945,351 A | * | 8/1999 | Mathuni | 438/706 |

FOREIGN PATENT DOCUMENTS

| | | |
|---|---|---|
| EP | 63243285 | 10/1988 |
| EP | 0558327 A2 * | 9/1993 |
| EP | 0558327 A1 | 9/1993 |
| EP | 0810641 A2 | 12/1997 |
| EP | 0810641 A2 * | 12/1997 |
| EP | 63243285 * | 10/1998 |

* cited by examiner

Primary Examiner—Benjamin L. Utech
Assistant Examiner—Charlotte A. Brown
(74) Attorney, Agent, or Firm—Sherman & Shalloway

(57) ABSTRACT

The present invention provides a processing method of outermost periphery edge part of silicon wafer comprising, etching the outermost periphery edge of silicon wafer by activated species gas generated in plasma. The plasma activated species gas can be generated by dissociation of, for example, sulfur hexafluoride gas in a discharge tube 8. Further, provides a processing apparatus for etching of outermost periphery edge of silicon wafer by means of plasma etching method comprising, a means to hold and rotate a silicon wafer 1, a container 5 which covers all surface of silicon wafer except a part of outermost periphery edge, a vacuum chamber 10 which contain said container and a plasma generating means 11.

4 Claims, 1 Drawing Sheet

PROCESSING APPARATUS FOR ETCHING THE EDGE OF A SILICON WAFER

BACKGROUND OF THE INVENTION

1. Field of the Invention

Figure 1:
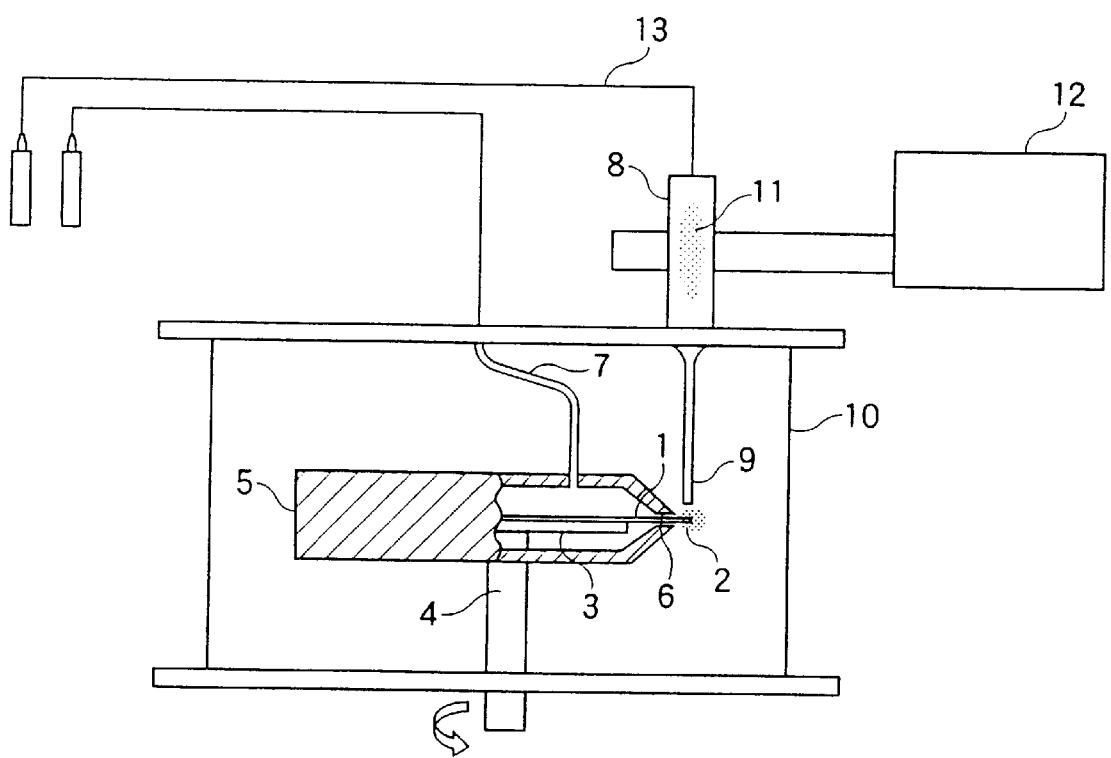

The present invention relates to a processing method of the outermost periphery edge of silicon wafer, more in detail relates to a mirror finishing method of chamfered outermost periphery edge of silicon wafer by a plasma etching method and an apparatus for mirror finishing by plasma etching.

2. Description of the Prior Art

Electric parts such as IC, LSI, or VLSI which are made from semiconductor materials e.g. silicon mono crystalline are produced as follows. That is, an ingot of silicon mono crystalline compound semiconductor is sliced to a thin wafer, precise electrical circuit pattern is formed on the surface of wafer and divided to chips. At the processing of silicon wafer, which is a starting material of these electric parts, the outermost periphery of wafer is chamfered to have obtuse angles or an arc profile and mirror finished as well as the surface of wafer not to be chipped and not to enfold fine particles of dust. Especially, from the view point of a tendency to smaller size and larger integration of these electric parts, or along with the rapid progress of epitaxial technique, more precise surface roughness is becoming to be required not only on the surface of silicon wafer but also on the outermost periphery edge of silicon wafer.

An as cut wafer which is prepared by slicing an ingot is lapped, etched and polished as to processed to a mirror finished wafer at least one side is mirror finished. On the mirror finished surface, fine and precise electrical pattern is formed at the device process. The wafer is processed maintaining the original disk shape until it is divided to unit semiconductor chips between above mentioned main processes, there are washing, drying and transporting processes. If the outermost periphery of the wafer has steep and sharp edge and coarser surface roughness during above mentioned series of processes, the sharp edge contacts with an apparatus or other substance and very fine particles are generated by very small breaking. Further, very fine contamination particles are caught in the coarse surface of edge, and the enfolded fine contamination particles are released at, the latter process and cause the contamination problem of the precise finished surface, which deteriorate the yield of products and the surface quality. Usually, to prevent above mentioned problem, the outermost periphery edge of the wafer is chamfered and mirror finished at, the early stage of the wafer processing.

In general, the above mentioned edge polishing is carried out, by following method. Namely, the outermost periphery edge of the wafer is chamfered using beveling grinding stone containing diamond abrasives, then the chamfered edge is polished by an edge polishing machine which is disclosed, for example, in Japanese Patent Laid Open Publication 64-71656 or Japanese Patent Laid Open Publication 1-171656. Said edge polishing machine uses polishing pad and slurry containing abrasives and the polishing is carried out in wet condition. According to these type of machine, the edge polishing process is very complicated and takes long time, further scratches by diamond abrasive can not be removed perfectly and remain on the surface of outermost periphery edge. The depth of remained scratches is shallower than as chamfered wafer, however, still have a tendency to enfold fine contamination particles. The requirement for improvement of this point is becoming more severe along with the progress of the tendency to smaller size and larger integration of IC, LSI or VLSI, and the required precision for silicon wafer processing becomes more strict.

Since said conventional method is based on wet condition, the load to wasted water treating facilities is relatively high, further it is pointed out as the problem that the setting up of the preparing apparatus for DI water which is necessary for the edge polishing is necessary. Further, when the edge polishing is carried out after the surface polishing of the wafer, since slurry, fine fluff of polishing pad or fine debris of silicon wafer are stuck to the mirror finished surface of wafer and contaminate the mirror finished surface, it is necessary to set up another washing process. And said contamination causes new stains or scratches, therefore said conventional method can not be said as a sufficient, method.

In the meanwhile, as the method to process the wafer surface in dry condition, the method by plasma etching is proposed for instance in Japanese Patents Laid open Publication 9-115887. In said method a wafer is transferred to the horizontal direction and the surface is processed partially and whole surface is processed gradually, thus the planarization of whole wafer surface can be accomplished. By this method, since D.I water is not needed and does not, generate waste water, a clean processing Without environmental contamination can be possible. However, up to the present, said plasma etching method is limited only to the surface processing.

BRIEF SUMMARY OF THE INVENTION

The inventors of this invention have carried out an intensive study to dissolve the problem of surface roughness at the edge polishing of the outermost periphery of silicon wafer along with the improvement of processing accuracy of silicon wafer, and find out that, by polishing the outermost periphery edge of silicon wafer using a plasma etching method disclosed in said Japanese Patent Laid open Publication 9115887, desired fine mirror finished edge surface can be obtained and accomplished present invention. The object of this invention is to provide a mirror finishing method by plasma etching of the outermost periphery of silicon wafer, and another object of this invention is to provide an apparatus for mirror finishing by plasma etching apparatus.

The above mentioned object can be accomplished by a silicon wafer processing method comprising, etching the outermost periphery edge of silicon wafer by activated species gas generated in plasma. Said activated species gas generated in plasma can be produced for example by dissociation of sulfur hexafluoride gas in a discharge tube. And another object of this invention can be accomplished by a plasma etching polishing apparatus for outermost periphery edge of silicon wafer comprising a means to hold and rotate a silicon wafer, a container which cover all surface of silicon wafer except a part of outermost periphery edge, a vacuum chamber which contain said container and a plasma generating means. In said plasma etching polishing apparatus for outermost periphery edge of silicon wafer, it is desirable that the inside of the container which cover all surface of silicon wafer except a part of outermost periphery edge is maintained at positive pressure condition by nitrogen gas or inert gas.

The rough surface of silicon wafer is averaged by the irradiation of plasma activated species gas, and a precise surface corresponding to a polished surface can be obtained. The polishing of outermost periphery edge of silicon wafer can be carried out by containing a silicon wafer in a container which covers all surface of silicon wafer except, a part of outermost periphery edge, maintaining the inside of container at, plus pressure condition by nitrogen gas or inert gas, then irradiating whole outermost periphery edge of silicon wafer by plasma activated species gas rotating said silicon wafer,

BRIEF ILLUSTRATION OF THE DRAWING

FIG. 1 is a cross sectional view of the outermost periphery edge of silicon wafer processing apparatus by plasma etching.

In the drawing, each numerical marks indicate;
1: silicon wafer, 2: part of outermost periphery edge of silicon wafer, 3: table, 4: rotating shaft, 5: dispersion preventing container, 6: slit opening, 7: inert gas supplying line, 8: quartz reactor tube, 9: nozzle, 10: vacuum chamber, 11: plasma generation zone, 12: electric source for microwave, 13: process gas supplying line

DETAILED DESCRIPTION OF THE INVENTION

The edge part of outermost periphery of a silicon wafer which is the work piece of this invention is previously chamfered by a beveling grinding stone. The edge of outermost, periphery after beveling is chamfered to have angle of about 2° to upper and lower surface or to have arc shape. In the chamfered surface, scratchs by diamond abrasive are remaining, and the surface is uneven having surface roughness of 350–400 nm Ra around. Whole surface of silicon wafer except outermost periphery edge is sealed, and when said plasma activated species gas is irradiated to the outermost periphery edge the surface roughness of edge part is improved to 5–15 nm Ra around, which is same level to the surface roughness obtained by the conventional polishing. It is obvious that the processing corresponding to polishing can be made by said method.

The polishing by plasma etching method of this invention is illustrated as follows. That is, a volatile molecule is formed by the reaction between reactive radical of specific atom which is plasma excited in a plasma generating tube and an atom in solid, and the surface of solid is removed by vaporizing of said formed volatile molecules In the present invention, it is intended to use said removing phenomenon to the processing of outermost periphery edge of silicon wafer. The important point, of this invention is to use sulfur hexafluoride gas as a material gas and to generate activated species gas by exciting said material gas in a reactor tube, and to irradiate said activated species gas to a part of outermost periphery edge of silicon wafer as to carry out a processing corresponding to an edge polishing. The irradiated activated species gas attacks preferably a sharpen point in coarse surface of outermost periphery edge of silicon wafer, reacts with silicon atoms and forms volatile silicon tetrafluoride molecules, which are vaporizes off. Thus the sharpen parts are removed. Meanwhile, since the dented parts in coarse surface of outermost periphery edge of silicon wafer is shielded by sharpen points, said reaction by the irradiation of activated species gas is very slow. Therefore, the sharpen points and dented parts are averaged and the surface roughness is improved. As mentioned above, the surface roughness of outermost periphery edge of silicon wafer can be improved to 5–110 nm Ra around by said method. As the reactor tube for plasma generation, for example, a tube made of quartz, alumina or sapphire can be used.

This method is carried out in dry condition and uses chemical reaction in gas phase and solid phase, and does not use liquid type polishing compound such as colloidal silica. Therefore, compared with the conventional method, it is not necessary to take the waste water into consideration. Further, compared with the conventional method, since it is not, necessary to wash the surface after the processing, one washing process can be shortened.

The present, invention will be understood more readily with reference to the drawing, however, the drawing is only intended to illustrate the invention and not be construed to limit the scope of the invention. FIG. 1 is a drawing showing one embodiment of an apparatus which process the outermost periphery edge of silicon wafer according to the plasma etching method. In the drawing, silicon wafer 1 is placed on a table 3 which can be rotated, and is contained in a dispersion preventing container 5. At one part of said dispersion preventing container 5, a narrow slit opening 6 which has slightly wider than the thickness of silicon wafer 1 is arranged. From the slit opening 6, a small part of outermost periphery 2 of silicon wafer is exposed. To the dispersion preventing container 5, an inert gas supplying line 7 is connected, from which nitrogen gas or other inert gas can be introduced. Closely to the outermost, periphery 2 of silicon wafer exposed from the narrow slit opening 6, a nozzle 9 of a quartz reactor tube 8 for plasma generation is arranged. Said dispersion preventing container 5 and nozzle 9 part of a quartz reactor tube 8 are contained in a vacuum chamber 10. The another end of the quartz reactor tube 8 is connected to a process gas supplying line 13, and to plasma generation zone 11 an electric source for microwave 12 is arranged.

Sulfur hexafluoride gas which is the process gas is introduced from the process gas supplying line 13 with driving a vacuum pump (not shown in drawing) connected to the vacuum chamber 10, operating plasma generator and generate activated species gas from the quartz reactor tube 8 and the generated gas is irradiated from the nozzle 9. Silicon wafer 1 is rotated by constant rotating speed by a driving motor (not shown in drawing) connected to the rotating shaft 4 of table 3, and small part of the outermost periphery edge 2 of silicon wafer is exposed from the narrow slit opening 6 arranged to the dispersion preventing container 5. The exposed outermost periphery edge part is etched by the activated species gas irradiated from the nozzle 9 of said quartz reactor tube. The activated species gas enfolds and attacks whole area of exposed outermost periphery edge of silicon wafer, and achieve the uniform processing.

From the inert gas supplying line 7 connected to the dispersion preventing container 5, since nitrogen gas or other kinds of inert gas is supplied by adequate flow rate, the inside of the dispersion preventing container 5 is constantly maintained at, plus pressure, and so the activated species gas irradiated from quartz reactor tube 8 does not enter into the dispersion preventing container 5. Therefore, the activated species gas does not contact to the surface of silicon wafer which is shield in the dispersion preventing container 5 and the surface of silicon wafer is not, affected by plasma activated species gas. That is, by use of this apparatus, partial preferable processing limited to the outermost periphery edge of silicon wafer can be possible. By rotating a silicon wafer by constant rotating speed, the processing of all outermost periphery edge of silicon wafer can be carried out.

EXAMPLE

The present invention will be understood more readily with reference to the Example, however, not intended to limit the scope of the invention.

Example

The condition for plasma generation is set up as follows, and the operating condition of the dispersion preventing container is also set up as follows. The outermost periphery edge of 300 mm diameter silicon wafer is processed by a plasma etching method of this invention.

[Condition for Plasma Generation]

flow rate of sulfur hexafluoride gas: 300 sccm microwave out put: 300 W diameter of discharge tube: 25 mmφ inside diameter of nozzle: 5 mmφ

[Dispersion Preventing Container]

flow rate of nitrogen gas: 500 sccm width of slit opening: 3 mm length of wafer exposing: 2 mm The surface roughness of outermost periphery edge of silicon wafer after etching by plasma is measured by AFM, and it is observed that, the surface roughness Ra is improved to the level of 6.8 nm, and by the inspection by naked eyes of inspectors it is obvious that the surface become lustrous and the mirror finished surface is obtained. For the measurement of surface roughness, 10 points are measured and averaged.

The processing time to process all outermost periphery edge of silicon wafer is about, 1 minute and 30 seconds.

Effect of the Invention

The experimental results by etching on outermost periphery edge of silicon wafer by the plasma etching method of this invention is described in above mentioned Example, and almost same or better results can be obtained compared to the results obtained by the conventional polishing method which uses polishing pad and polishing compound. Since the method of this invention is based on the dry condition, the followed washing and drying processes can be omitted, and it can promise to save human power and energy. Further, it is possible to shorten the number of process and can contribute to improve the yield of product. Furthermore, it is possible to reduce the total amount of wasted water from the factory, and to reduce the load to the wasted water treating facility.

What is claimed is:

1. A processing apparatus for etching of outermost periphery edge part of silicon wafer by means of plasma etching method possessing a means to hold and rotate a silicon wafer, comprising a container which covers the surface of silicon wafer except a part of outermost periphery edge, a vacuum chamber which contains said container and a plasma generating means having a process gas composed of sulfur hexafluoride gas.

2. The processing apparatus for etching of outermost periphery edge of silicon wafer of claim 1, wherein inside of the container which covers all surface of silicon wafer except a part of outermost periphery edge is maintained at plus pressure relative to the inner pressure of the vacuum chamber which contains said container by nitrogen gas or other inert gas.

3. An apparatus for etching the outermost periphery edge of a silicon wafer by plasma etching which comprises, a rotating shaft on which is provided a table that rotates with the shaft, the table is adapted to receive and hold a circular silicon wafer which rotates with the shaft, a dispersion preventing container is disposed around the silicon wafer table and shaft, except for a small slit opening at an end of the container through which an outer edge part of the silicon wafer is exposed, and an opening through which the rotating shaft passes, an inert gas supply line is connected to the dispersion preventing container to supply an inert gas and maintain a positive gas pressure in the dispersion preventing container, there is disposed near to and in operative relationship with the small slit opening and the exposed part of the outermost periphery edge of the silicon wafer, a nozzle which is directed at the periphery edge of the silicon wafer is disposed near to and in operative relationship with the small slit opening and the exposed part of the outermost periphery edge of the silicon wafer.

4. The apparatus of claim 3 wherein the dispersion preventing container and the gas nozzle are contained within a vacuum chamber which is maintained at a negative pressure relative to the pressure in the dispersion preventing container.

\* \* \* \* \*